(12) United States Patent
Lee et al.

(10) Patent No.: US 8,851,952 B2
(45) Date of Patent: Oct. 7, 2014

(54) METHOD OF MANUFACTURING AN ORGANIC LIGHT EMITTING DIODE DISPLAY DEVICE

(71) Applicant: Samsung Display Co., Ltd., Yongin (KR)

(72) Inventors: Duk-Jin Lee, Yongin (KR); Woo-Suk Jung, Yongin (KR); Sang-Hun Park, Yongin (KR); Kyu-Ho Jung, Yongin (KR); Noh-Min Kwak, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 27 days.

(21) Appl. No.: 13/935,269

(22) Filed: Jul. 3, 2013

(65) Prior Publication Data

US 2013/0295816 A1    Nov. 7, 2013

Related U.S. Application Data

(62) Division of application No. 12/379,777, filed on Feb. 27, 2009, now Pat. No. 8,492,969.

(30) Foreign Application Priority Data

Jun. 26, 2008 (KR) .......................... 10-2008-0061125

(51) Int. Cl.
*H01J 9/00* (2006.01)
*H05B 33/04* (2006.01)
*H01L 51/52* (2006.01)

(52) U.S. Cl.
CPC .............. *H05B 33/04* (2013.01); *H01L 51/524* (2013.01)
USPC .............................................. 445/25; 445/24

(58) Field of Classification Search
CPC ........................................................ H05B 33/04
USPC ................................ 313/498–512; 445/24, 25
See application file for complete search history.

(56) References Cited

U.S. PATENT DOCUMENTS

| 6,537,688 | B2 | 3/2003 | Silvernail et al. |
| 2002/0015005 | A1 | 2/2002 | Imaeda |
| 2002/0051102 | A1 | 5/2002 | Kuroki et al. |
| 2004/0080267 | A1 | 4/2004 | Cok |
| 2004/0135936 | A1 | 7/2004 | Lee |
| 2004/0169786 | A1 | 9/2004 | Yamazaki et al. |
| 2004/0189196 | A1 | 9/2004 | Cok |
| 2004/0238827 | A1 | 12/2004 | Takayama et al. |
| 2005/0110404 | A1* | 5/2005 | Park et al. ...................... 313/512 |

(Continued)

FOREIGN PATENT DOCUMENTS

| CN | 101202329 A | 6/2008 |
| JP | 05-333359 A | 12/1993 |

(Continued)

*Primary Examiner* — Anh Mai
*Assistant Examiner* — Zachary J Snyder
(74) *Attorney, Agent, or Firm* — Robert E. Bushnell, Esq.

(57) ABSTRACT

An organic light emitting diode (OLED) display and a method of manufacturing the same are provided. The OLED display includes: a display panel assembly including a first substrate having a display area and a mounting area, a second substrate coupled to the display area of the first substrate, and an integrated circuit chip mounted in the mounting area of the first substrate; a cover window disposed opposite the second substrate and the integrated circuit chip and covering the display panel assembly; and an adhesive layer which fills up a space between the second substrate and the cover window, and a space between the mounting area of the first substrate and the cover window.

20 Claims, 8 Drawing Sheets

(56) References Cited

U.S. PATENT DOCUMENTS

| | | |
|---|---|---|
| 2005/0155704 A1 | 7/2005 | Yokajty et al. |
| 2005/0189878 A1 | 9/2005 | Shitagami et al. |
| 2005/0285520 A1 | 12/2005 | Cok |
| 2006/0103285 A1 | 5/2006 | Lee |
| 2006/0135029 A1* | 6/2006 | Harada .................. 445/25 |
| 2006/0220991 A1 | 10/2006 | Lee et al. |
| 2007/0046191 A1 | 3/2007 | Saito |
| 2007/0216291 A1 | 9/2007 | Jung |
| 2008/0261057 A1 | 10/2008 | Slobodin |
| 2009/0066242 A1 | 3/2009 | Koo |

FOREIGN PATENT DOCUMENTS

| | | |
|---|---|---|
| JP | 11-73140 A | 3/1999 |
| JP | 11-143385 A | 5/1999 |
| JP | 2000040586 | 2/2000 |
| JP | 2002032037 | 1/2002 |
| JP | 2003-178876 A | 6/2003 |
| JP | 2004240412 | 8/2004 |
| JP | 2005-18051 A | 1/2005 |
| JP | 2005017333 | 1/2005 |
| JP | 2005116339 | 4/2005 |
| JP | 2005189597 | 7/2005 |
| JP | 2005293946 | 10/2005 |
| JP | 2007080711 | 3/2007 |
| JP | 2008059945 | 3/2008 |
| JP | 2008090053 | 4/2008 |
| TW | 200415422 | 8/2004 |
| TW | 1256128 | 6/2006 |
| WO | 2007066424 A1 | 6/2007 |

* cited by examiner

FIG.9

METHOD OF MANUFACTURING AN ORGANIC LIGHT EMITTING DIODE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on the 26 Jun. 2008 and there duly assigned Serial No. 10-2008-0061125. Furthermore, this application is filed pursuant to 35 U.S.C. §121 as a Divisional application of Applicants' patent application Ser. No. 12/379,777 filed in the U.S. Patent & Trademark Office on 27 Feb. 2009, issued as U.S. Pat. No. 8,492,969 on 23 Jul. 2013, and assigned to the assignee of the present invention. All benefits accruing under 35 U.S.C. §120 from the aforesaid present application Ser. No. 12/379,777 and U.S. Pat. No. 8,492,969 are also claimed.

BACKGROUND OF THE INVENTION

1. Field of the Invention

The present invention relates to an organic light emitting diode (OLED) display and a method of manufacturing the same. More particularly, the present invention relates to an OLED display and a method of manufacturing the same in which stability and reliability of a display panel assembly are improved.

2. Description of the Related Art

An organic light emitting diode (OLED) display includes a plurality of organic light emitting diodes having a hole injection electrode, an organic emission layer, and an electron injection electrode. The OLED display emits light by energy which is generated when excitons, which are generated when electrons and holes are coupled within the organic emission layer, fall from an exited state to a ground state, thereby forming an image.

Therefore, because the OLED display (unlike a liquid crystal display (LCD)) has self-luminance characteristics and does not require a separate light source, the thickness and weight thereof can be reduced. Furthermore, because the OLED display represents high quality characteristics, such as low power consumption, high luminance and a high reaction speed, the OLED display has been in the spotlight as the next generation display device for portable electronic devices.

In general, the OLED display includes a display panel assembly in which the organic light emitting diodes are formed and a printed circuit board (PCB) which is electrically connected to the display panel assembly through a flexible printed circuit board (FPCB). Furthermore, the OLED display also includes a support member for supplementing mechanical strength and stability of the display panel assembly by coupling to the display panel assembly, and a cover window for covering one surface of the display panel assembly which displays an image.

In the display panel assembly, the cover window is generally disposed separate by a predetermined separation space from the display panel assembly. Light which is emitted from the display panel assembly is emitted to the outside via the separation space and the cover window. Therefore, there is a problem in that visibility of an image which is displayed by the OLED display is deteriorated due to a difference in refractive indexes of the cover window and the separation space, deterioration of a refractive index due to the separation space, and reflection of light occurring in the cover window and a display panel assembly surface.

Furthermore, there is a problem in that an entire thickness of the OLED display becomes large due to the separation space between the cover window and the display panel assembly.

The above information disclosed in this section is provided only for enhancement of an understanding of the background of the invention, and therefore it may contain information that does not form the prior art which is already known to a person of ordinary skill in the art.

SUMMARY OF THE INVENTION

The present invention has been developed in an effort to provide an organic light emitting diode (OLED) display and a method of manufacturing the same having the advantages of improved stability and reliability of a display panel assembly.

The present invention has also been developed in an effort to provide an OLED display and a method of manufacturing the same having the advantages of stably covering an integrated circuit chip in a display panel assembly, and stably coupling a cover window and the display panel assembly.

The present invention has been developed in an effort to further provide an OLED display and a method of manufacturing the same having the advantage of minimizing an entire thickness thereof.

The present invention has also been developed in an effort to provide an OLED display and a method of manufacturing the same having the advantage of improved productivity.

An exemplary embodiment of the present invention provides an OLED display which includes: a display panel assembly including a first substrate having a display area and a mounting area, a second substrate coupled to the display area of the first substrate, and an integrated circuit chip mounted in the mounting area of the first substrate; a cover window disposed opposite to the second substrate and the integrated circuit chip, and covering the display panel assembly; and an adhesive layer which fills up a space between the second substrate and the cover window and a space between the mounting area of the first substrate and the cover window.

The adhesive layer may include an acryl-based resin and cover the integrated circuit chip.

The cover window may be transparent.

The cover window may include a light transmitting portion corresponding to a central portion of the display area and a light blocking portion corresponding to an edge of the display area and the mounting area.

The OLED display may further include a support member which receives and supports the display panel assembly, and the support member may include a bottom portion which is formed in parallel with the first substrate and a side wall which extends from the bottom portion and which surrounds side surfaces of the first substrate and the second substrate.

The side wall may be formed apart by a predetermined distance from edges of the first substrate and the second substrate, and the adhesive layer may be formed by filling up a space between the side wall and edges of the first substrate and the second substrate.

The predetermined distance may be greater than 200 µm.

Another embodiment of the present invention provides a method of manufacturing an OLED display, including: providing a display panel assembly which includes a first substrate having a display area and a mounting area, a second substrate coupled to the display area of the first substrate, and an integrated circuit chip mounted in the mounting area of the first substrate; providing a cover window; providing an adhesive material on one surface of the cover window; coupling the cover window to the display panel assembly so that one surface of the cover window, in which the adhesive material is provided, is opposite the second substrate and the integrated circuit chip; diffusing the adhesive material to fill up a space between the second substrate and the cover window and a space between the mounting area of the first substrate and the cover window; and forming an adhesive layer by curing the adhesive material.

The adhesive material may include an acryl-based resin, and the adhesive layer may be formed by cuing the adhesive material through radiating ultraviolet rays (UV) or applying heat to the adhesive material.

The method may further include allowing a part of an adhesive material which is provided on the cover window to flow and to contact a part of the display panel assembly, and then coupling the cover window and the display panel assembly.

The method may further include receiving the display panel assembly in a support member, wherein the support member includes a bottom portion formed in parallel with the first substrate and a side wall which extends from the bottom portion and which surrounds side surfaces of the first substrate and the second substrate, and wherein the side wall may be disposed apart by a predetermined distance from edges of the first substrate and the second substrate.

The adhesive material may be filled and cured in the space between the side wall and the edges of the first substrate and the second substrate, and may form the adhesive layer.

The predetermined distance may be greater than 200 μm.

According to the present invention, the OLED display can have a display panel assembly having improved stability and reliability.

Furthermore, the OLED display can have a cover window and a display panel assembly which are stably coupled to each other, and an integrated circuit chip which is stably covered by the cover window.

Furthermore, the entire thickness of the OLED display can be minimized.

In addition, productivity of the OLED display can be improved.

Moreover, the OLED display can be effectively manufactured.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention will be described more fully hereinafter with reference to the accompanying drawings, in which exemplary embodiments of the invention are shown. The present invention is not limited to the exemplary embodiments, but may be embodied in various forms.

Furthermore, because the size and thickness of each element displayed in the drawings are randomly displayed for better understanding and ease of description, the present invention is not limited thereto.

Accordingly, the drawings and description are to be regarded as illustrative in nature and not restrictive. Like reference numerals designate like elements throughout the specification.

In addition, in the drawings, the thickness of layers, films, panels, regions, etc., are exaggerated for clarity. Like reference numerals designate like elements throughout the specification. It will be understood that, when an element such as a layer, film, region or substrate is referred to as being "on" another element, it can be directly on the other element or intervening elements may also be present. In contrast, when an element is referred to as being "directly on" another element, there are no intervening elements present.

Figure 1:
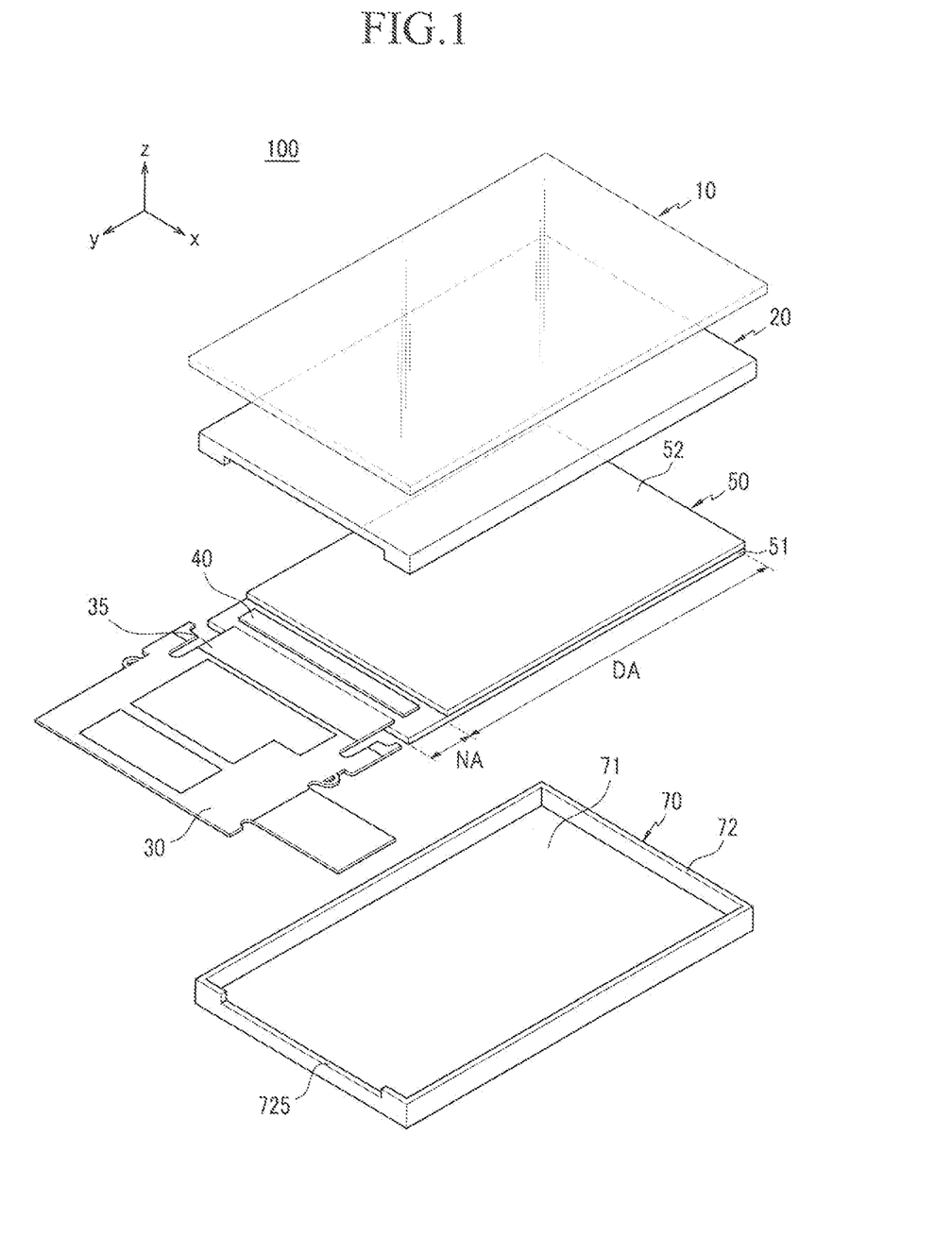
FIG. 1 is an exploded perspective view of an organic light emitting diode (OLED) display according to an exemplary embodiment of the present invention.
Figure 2:
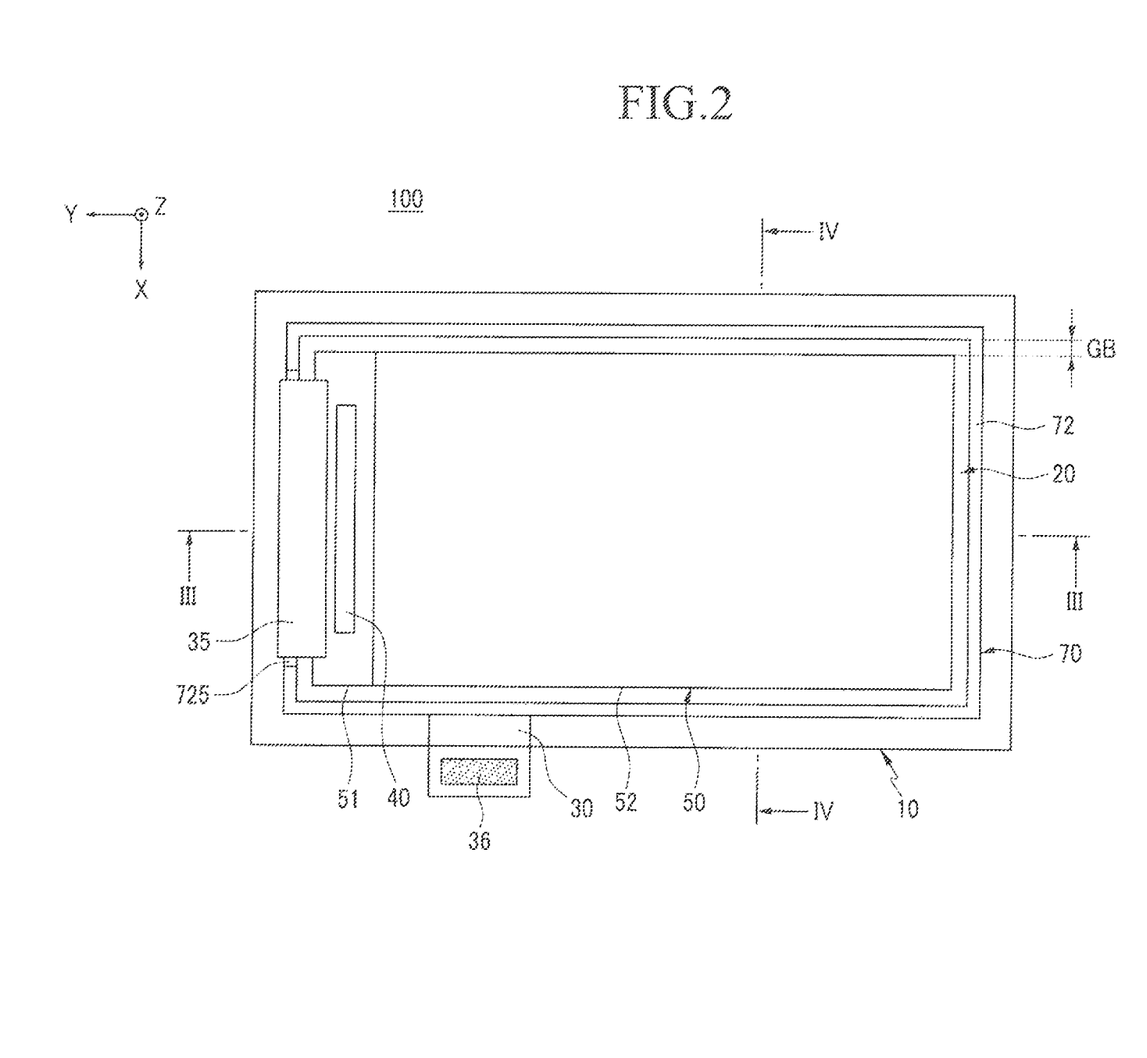
FIG. 2 is a top plan view illustrating a coupled state of the OLED display of FIG. 1.
Figure 3:
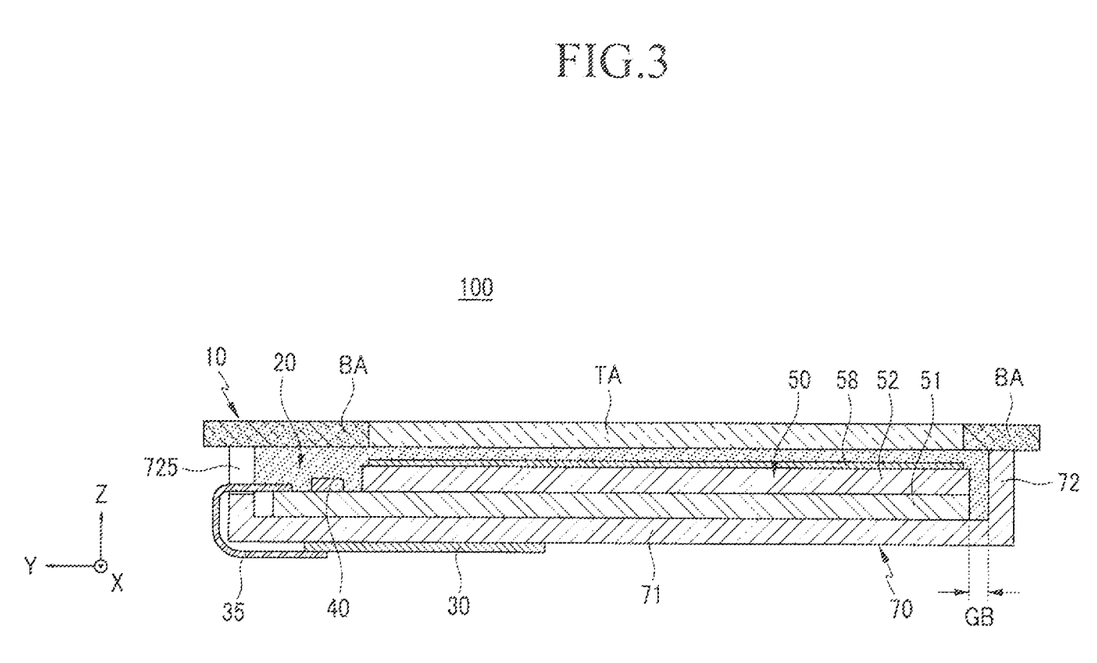
FIG. 3 is a cross-sectional view of the OLED taken along line III-III of FIG. 2.
Figure 4:
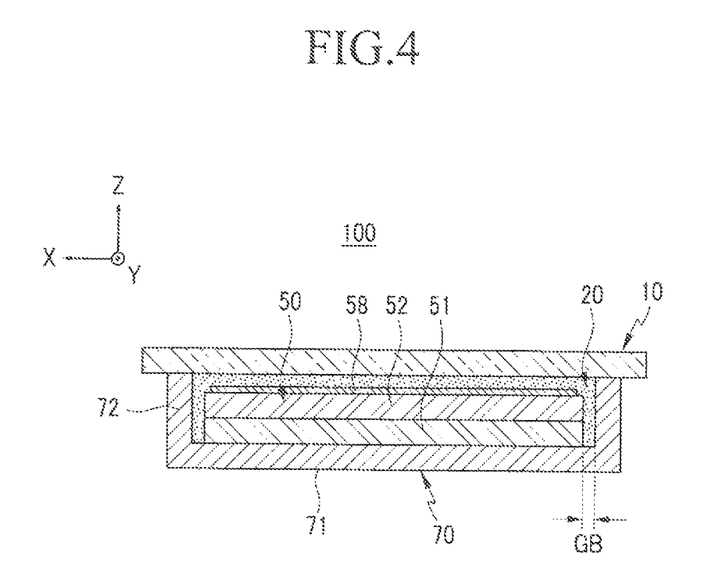
FIG. 4 is a cross-sectional view of the OLED taken along line IV-IV of FIG. 2.

FIG. 1 is an exploded perspective view of an organic light emitting diode (OLED) display according to an exemplary embodiment of the present invention, FIG. 2 is a top plan view illustrating a coupled state of the OLED display of FIG. 1, FIG. 3 is a cross-sectional view of the OLED taken along line III-III of FIG. 2, and FIG. 4 is a cross-sectional view of the OLED taken along line IV-IV of FIG. 2.

As shown in FIGS. 1 and 2, the OLED display 100 includes a display panel assembly 50, a cover window 10, and an adhesive layer 20. The OLED display 100 further includes a support member 70, a PCB 30, and an FPCB 35.

The display panel assembly 50 includes a first substrate 51, a second substrate 52, and an integrated circuit chip 40. The first substrate 51 has a display area DA and a mounting area NA. The second substrate 52 has a size smaller than that of the first substrate 51, and is attached to the display area DA of the first substrate 51. The first substrate 51 and the second substrate 52 are coupled by a sealant (not shown) disposed along an edge of the second substrate 52. The integrated circuit chip 40 is mounted in the mounting area NA of the first substrate 51. In this case, the integrated circuit chip 40 is mounted on a surface having a direction equal to that of an attaching surface of the second substrate 52 in the first substrate 51. The second substrate 52 and the integrated circuit chip 40 are adjacently disposed.

The first substrate 51 includes pixels (shown in FIGS. 5 and 6) disposed in a matrix form in the display area DA. The first substrate 51 further includes a scan driver (not shown) and a data driver (not shown) disposed in the display area DA or the mounting area NA to drive pixels. The first substrate 51 further includes pad electrodes (not shown) disposed in the mounting area NA. The integrated circuit chip 40 is mounted in the mounting area NA of the first electrode 51 so as to be electrically connected to the pad electrode (not shown). The first substrate 51 further includes a wire (not shown) for connecting the integrated circuit chip 40, the scan driver (not shown), and the data driver (not shown).

The second substrate 52 is bonded to the first substrate 51 so as to seal up and protect pixels, circuits, and wires formed in the first substrate 51 from the outside. The display panel assembly 50 further includes a polarizing plate 58 (shown in FIG. 3) attached to one surface of the second substrate 52 for suppressing reflection of external light. However, the polarizing plate 58 is not always necessary and may be omitted.

The integrated circuit chip 40 is mounted in the mounting area NA (FIG. 1) of the first substrate 51 using a chip on glass (COG) method.

The support member 70 receives and supports the display panel assembly 50. The support member 70 includes a bottom portion 71 and a side wall 72. The bottom portion 71 is formed in parallel with the first substrate 51 of the display panel assembly 50. That is, the display panel assembly 50 is received in the support member 70 so that the first substrate 51 may be seated in the bottom portion 71. The side wall 72 is extended and protrudes from the bottom portion 71 so as to surround side surfaces of the first substrate 51 and the second substrate 52. In this case, the side wall 72 is formed apart by a predetermined separation distance GB from edges of the first substrate 51 and the second substrate 52. It is preferable that the predetermined separation distance GB be greater than 200 µm, and a reason thereof is described later.

The support member 70 has an opening 725 formed in a part of the side wall 72 adjacent to the mounting area NA of the first substrate 51 so that the FPCB 35 may be connected to the mounting area NA of the first substrate 51.

The support member 70 may be formed using various methods and with several materials. As an example, the support member 70 may be made of a material having high rigidity, i.e., a metal material such as stainless steel, cold rolling steel, aluminum, aluminum alloy, nickel alloy, magnesium, and magnesium alloy. The support member 70 having the bottom portion 71 and the side wall 72 may be formed by molding a metal plate made of such a metal material by a well-known deep drawing process or bending process. When molded by a deep drawing process, corners of the side wall 72 can be connected without a joint.

The PCB 30 includes electronic elements (not shown) for processing a driving signal and a connector 36 for receiving an external signal. One side of the FPCB 35 is connected to the mounting area NA of the first substrate 51 and the other side thereof is connected to the PCB 30. That is, the FPCB 35 electrically connects the PCB 30 and the display panel assembly 50. Therefore, a driving signal generated in the PCB 30 is transferred to integrated circuit chip 40 or a driver (not shown) of the first substrate 51 through the FPCB 35.

As shown in FIG. 3, the FPCB 35 is bent and the printed circuit board PCB 30 is disposed on a rear surface of the support member 70.

The cover window 10 (FIG. 1) is disposed opposite the second substrate 52 and the integrated circuit chip 40, and entirely covers the display panel assembly 50. Specifically, the cover window 10 covers one surface of the display panel assembly 50 in an image display direction. The cover window 10 may be made of a transparent material, such as glass or plastic.

Furthermore, as shown in FIG. 3, the cover window 10 includes a light blocking portion BA corresponding to an edge of the display panel assembly 50 including the mounting area NA of the first substrate 51, and a light transmitting portion TA corresponding to a central portion of the display panel assembly 50. That is, the light blocking portion BA corresponds to an edge of the display area DA and the mounting area NA, and the light transmitting portion TA corresponds to a central portion of the display area DA. The light blocking portion BA performs the functions of blocking unnecessary light and covering a portion which does not display an image in the display panel assembly 50.

However, the present invention is not limited thereto. Therefore, the cover window 10 may be entirely transparent and formed without the light blocking portion BA. In this case, the OLED display 100 may further include a separate light blocking member.

The adhesive layer 20 may be made of a material including an acryl-based resin which is cured by ultraviolet (UV) or heat. Furthermore, the adhesive layer 20 has relatively higher elasticity than that of the cover window 10 and the support member 70.

As shown in FIGS. 1, 3 and 4, the adhesive layer 20 fills up a space between the second substrate 52 and the cover window 10 and a space between the mounting area NA of the first substrate 51 and the cover window 10. Furthermore, the adhesive layer 20 fills up a space between the side wall 72 of the support member 70 and edges of the first substrate 51 and the second substrate 52.

In this way, the adhesive layer 20 couples the cover window 10 and the display panel assembly 50 by filling up a space between the display panel assembly 50 and the cover window 10, and couples the support member 70 and the display panel assembly 50, and the support member 70 and the cover window 10, by filling up a space between the edge of the display panel assembly 50 and the side wall 72 of the support member 70.

Furthermore, the adhesive layer 20 fully covers and protects the mounting area NA of the first substrate 51 including the integrated circuit chip 40. That is, the adhesive layer 20 suppresses corrosion of the mounting area NA while mechanically protecting the integrated circuit chip 40. Accordingly, the display panel assembly 50 may render unnecessary a separate protective layer for protecting a circuit, a wire, and a pad formed in the mounting area NA of the first substrate 51.

Because the adhesive layer 20 prevents unnecessary separation of the display panel assembly 50 from the support member 70 and the cover window 10, and has relatively excellent elasticity, the adhesive layer 20 protects the display panel assembly 50, thereby improving mechanical stability and reliability of the OLED display 100. That is, the adhesive layer 20 protects the display panel assembly 50 from external impact. Accordingly, the OLED display 100 may render unnecessary a separate reinforcement for protecting the display panel assembly 50.

Furthermore, the adhesive layer 20 suppresses penetration of moisture into the display panel assembly 50, thereby improving environmental stability and reliability.

As described above, the adhesive layer 20 should be able to have a minimum thickness for preventing separation of elements and protecting the display panel assembly 50 from an external impact. Therefore, it is preferable to secure a separation distance GB between the side wall 72 of the support member 70 and the edge of the display panel assembly 50 to be greater than 200 µm in order to secure a minimum space in which the adhesive layer 20 is to be formed so that the adhesive layer 20 may have enough thickness.

Furthermore, it is preferable that a refractive index of the adhesive layer 20 be similar to that of the cover window 10. This is because the adhesive layer 20 fills up a space between the second substrate 52 and the cover window 10, and thus, when refractive indexes of the adhesive layer 20 and the cover window 10 become similar, reflection of light due to a difference in refractive indexes can be minimized. Because the refractive index of an acryl-based resin used as a material of the adhesive layer 20 is relatively more similar to that of the cover window 10 than air, and since the adhesive layer 20 fills up a space between the second substrate 52 and the cover window 10, reflection of light due to a difference between the refractive indexes can be effectively reduced.

In addition, as described above, because the OLED display 100 may render unnecessary a separate reinforcement for improving mechanical and environmental stability of a separate protective layer and the panel assembly 50 for protecting the integrated circuit chip 40, etc., productivity thereof can be improved.

By such a configuration, the OLED display 100 can have a display panel assembly 50 having improved stability and reliability.

That is, the display panel assembly 50, the cover window 10 and the support member 70 are stably coupled by the adhesive layer 20, and the mounting area NA of the first substrate 51 including the integrated circuit chip 40 is stably covered by the adhesive layer 20. Furthermore, an external impact applied to the display panel assembly 50 can be absorbed by the adhesive layer 20.

Because the cover window 10 is effectively fixed by the adhesive layer 20, an entire thickness of the OLED display 100 can be minimized.

Figure 5:
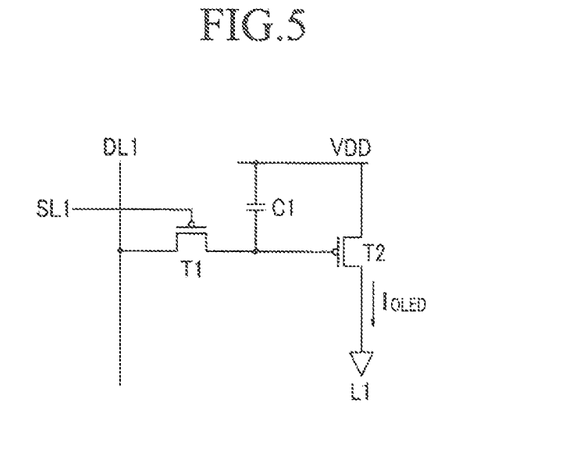
FIG. 5 is a diagram of a pixel circuit of a display panel assembly shown in FIG. 1.
Figure 6:
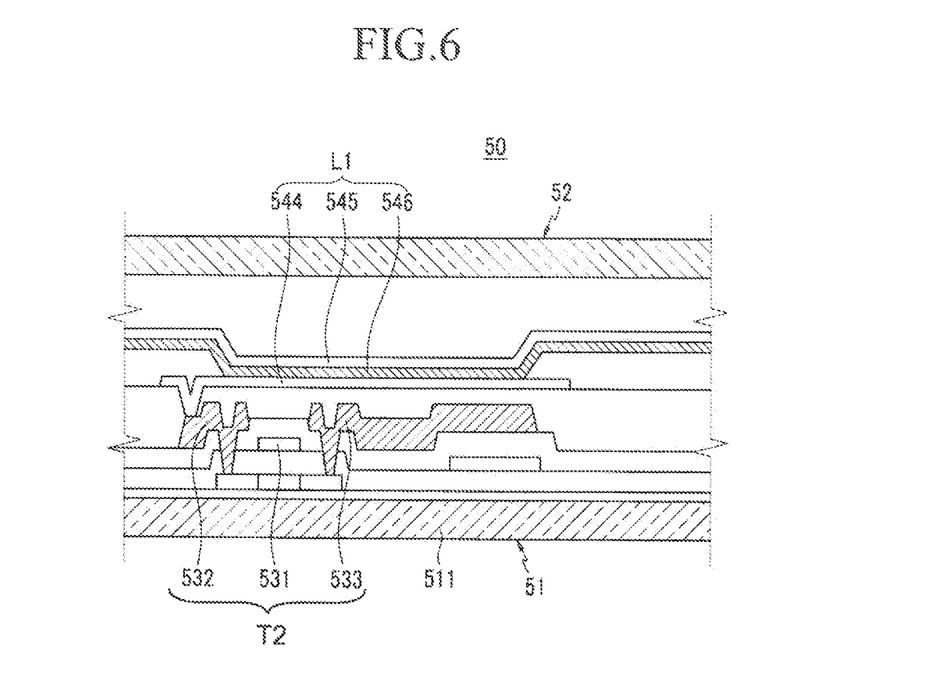
FIG. 6 is a partially-enlarged view of the display panel assembly shown in FIG. 1.

Referring to FIGS. 5 and 6, an internal structure of the display panel assembly 50 will be described hereinafter.

The display panel assembly 50 has a plurality of pixels and displays an image. As shown in FIGS. 5 and 6, the pixel includes an organic light emitting diode L1 and driving circuits T1, T2, and C1. The pixel is generally formed in the first substrate 51. That is, the first substrate 51 includes a substrate member 511, and the driving circuits T1, T2 and C1 and the organic light emitting diode L1 which are formed on the substrate member 511.

The organic light emitting diode L1 includes an anode 544, an organic emission layer 545, and a cathode 546. The driving circuits include at least two thin film transistors T1 and T2 and at least one storage capacitor C1. The thin film transistor basically includes a switching transistor T1 and a driving transistor T2.

The switching transistor T1 is connected to a scan line SL1 and a data line DL1, and transmits a data voltage which is inputted to the data line DL1 to the driving transistor T2 according to a switching voltage which is inputted to the scan line SL1. The storage capacitor C1 is connected to the switching transistor T1 and a power source line VDD, and stores a voltage corresponding to a difference between a voltage received from the switching transistor T1 and a voltage supplied to the power source line VDD.

The driving transistor T2 is connected to the power source line VDD and the storage capacitor C1 so as to supply an output current IOELD, which is proportional to a square of a difference between a voltage stored in the storage capacitor C1 and a threshold voltage, to the organic light emitting diode L1, and the organic light emitting diode L1 emits light by the output current IOELD. The driving transistor T2 includes a source electrode 533, a drain electrode 532, and a gate electrode 531, and the anode 544 of the organic light emitting diode L1 is connected to the drain electrode 532 of the driving transistor T2. The configuration of the pixel is not limited to the above-described example, and can be variously changed.

The second substrate 52 covers the first substrate 51 in which the organic light emitting diode L1 and the driving circuits T1, T2, and C1 are formed.

Figure 7:
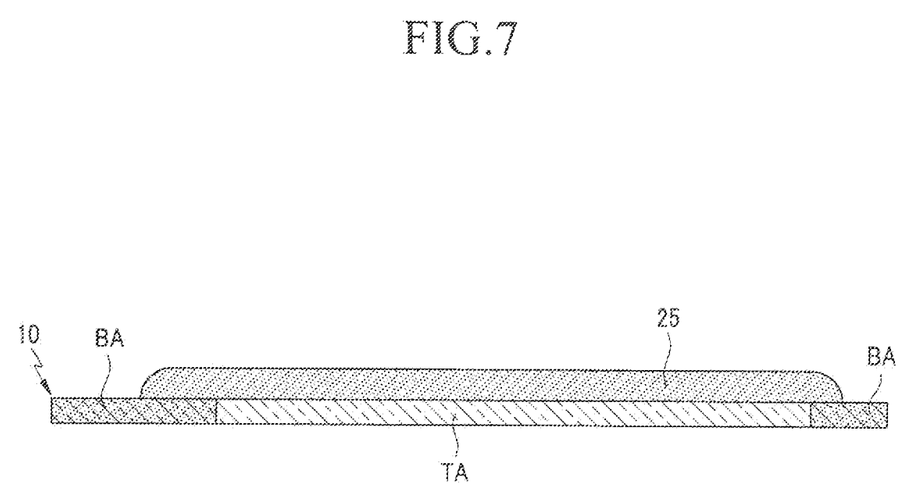
FIGS. 7 thru 9 are cross-sectional views sequentially illustrating a method of manufacturing the OLED display of FIG. 1.
Figure 8:
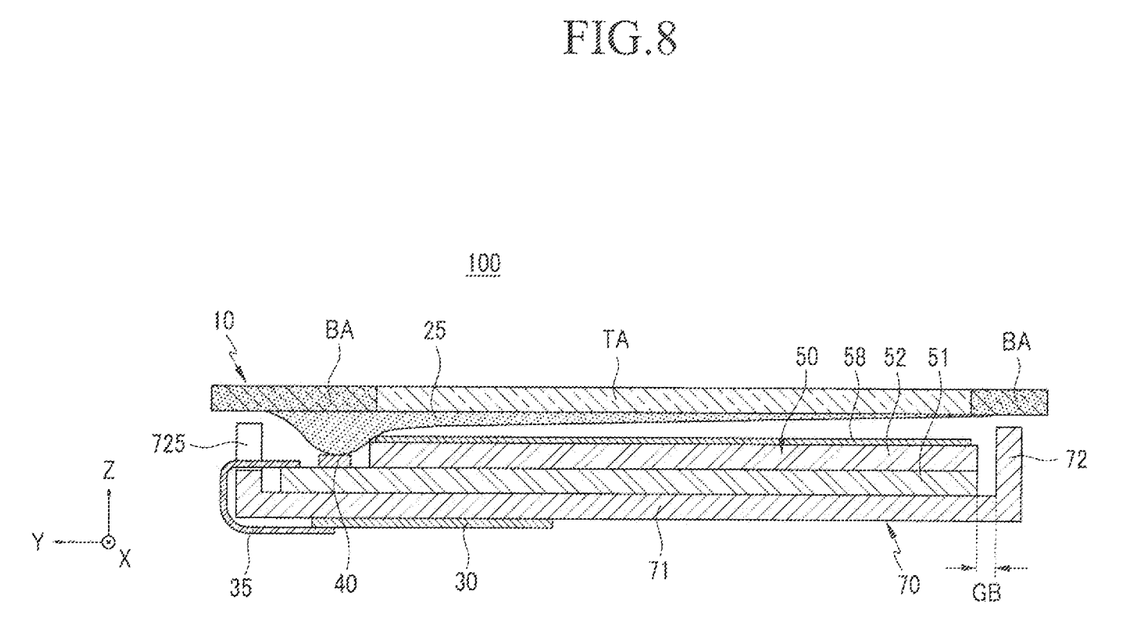
Figure 9:
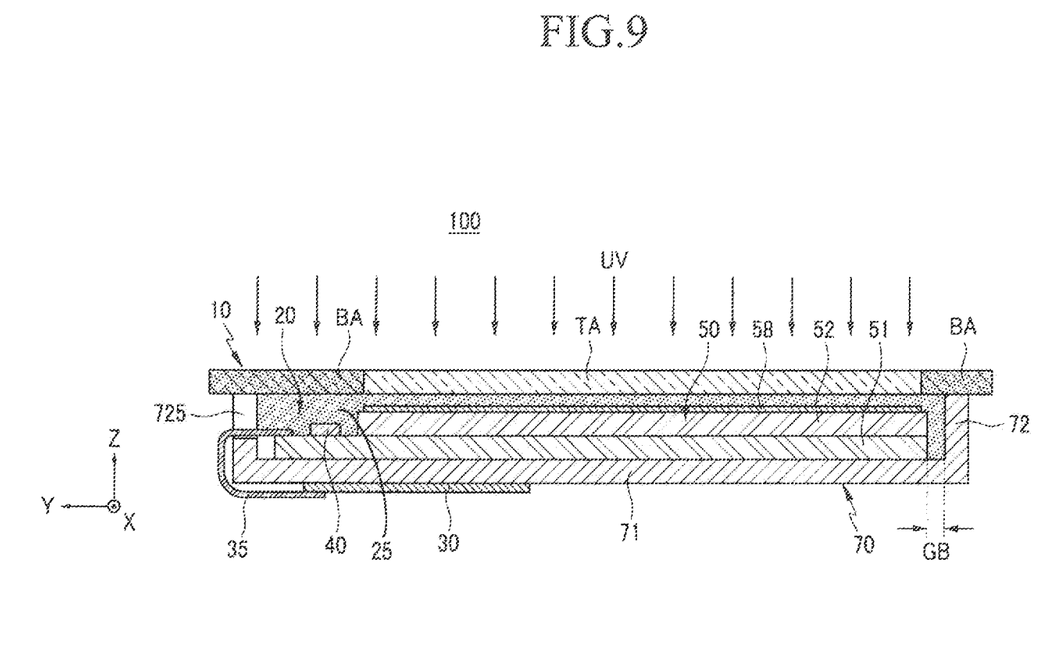

Referring to FIGS. 7 thru 9, a method of manufacturing the OLED display 100 of FIG. 1 is described hereinafter.

First, after the display panel assembly 50 is provided, the display panel assembly 50 is received in the support member 70 (see FIG. 1). A detailed structure of the display panel assembly 50 and the support member 70 has already been described.

Next, as shown in FIG. 7, after the cover window 10 is provided and a necessary quantity of the adhesive material 25 is determined, the adhesive material 25 is coated on one surface of the cover window 10. In FIG. 7, the cover window 10 includes the light blocking portion BA and the light transmitting portion TA, but the present invention is not limited thereto. Therefore, the cover window 10 may be entirely transparent.

Next, as shown in FIG. 8, the cover window 10 is coupled to the display panel assembly 50 so that one surface of the cover window 10, in which the adhesive material 25 is provided, may be opposite the second substrate 52 and the integrated circuit chip 40. In this case, the light blocking portion BA of the cover window 10 is disposed so as to correspond to each of the mounting area NA (shown in FIG. 1) of the first substrate 10 and an edge of the second substrate 52.

Furthermore, as shown in FIG. 8, the cover window 10 and the display panel assembly 50 are not directly coupled to each other, a part of the adhesive material 25 coated on the cover window 10 is flown and contacts the display panel assembly 50, and then the cover window 10 and the display panel assembly 50 are coupled to each other.

When the cover window 10 and the display panel assembly 50 are coupled using such a method, a bubble can be prevented from being generated in an interface of the adhesive material 25 and the display panel assembly 50.

Next, by pressurizing the cover window 10, the adhesive material 25 is diffused so as to fill up the space between the second substrate 52 and the cover window 10, the space between the mounting area NA of the first substrate 51 and the cover window 10, and the space between the side wall 72 of the support member 70 and an edge of the display panel assembly 50.

Next, as shown in FIG. 9, the adhesive layer 20 is completed by curing the adhesive material 25. In this case, the adhesive material 25 can completely be cured through two curing processes. The two curing processes include a preliminary curing process and a curing process. The preliminary curing process is performed using ultraviolet (UV), and the curing process is performed using UV or heat.

Furthermore, as shown in FIG. 9, UV rays are radiated onto the adhesive material 25 via the cover window 10, but the present invention is not limited thereto. Therefore, UV rays may be radiated in various directions in consideration of the structure of the support member 70 and the cover window 10. When UV rays are radiated in a sidewise direction of the display panel assembly 50, UV rays may be radiated with a moving method using an optical fiber.

The OLED display 100 having improved stability and reliability is manufactured using such a manufacturing method.

That is, the display panel assembly 50, the cover window 10 and the support member 70 are stably coupled by the adhesive layer 20, and the mounting area NA of the first substrate 51 including the integrated circuit chip 40 is stably covered by the adhesive layer 20. Furthermore, an external impact applied to the display panel assembly 50 can be absorbed by the adhesive layer 20.

In addition, because the cover window 10 is effectively fixed by the adhesive layer 20, an entire thickness of the OLED display 100 can be minimized.

Moreover, by shortening the manufacturing process, productivity can be improved.

Referring to Table 1 below, optical characteristics of an exemplary embodiment according to the present invention and a Comparative Example are described hereinafter. In the display area DA, the space between the cover window 10 and the display panel assembly 50 is filled with an adhesive layer which is entirely made of a polymer material, such as acryl-based resin, in the exemplary embodiment, and is filled with air in the Comparative Example.

TABLE 1

|  | Comparative Example | Experimental Example |
|---|---|---|
| luminance [cd/m$^2$] | 180 | 206 |
| contrast ratio of external light @ 10,000 lux | 1.74 | 2.45 |
| representation of external light color @ 10,000 | 5.3% | 14.5% |
| transmittance of cover window [%] | 91.8% | 91.8% |
| reflection ratio of cover window and display panel assembly [%] | 7.44% | 4.35% |

As shown in Table 1, the exemplary embodiment has excellent optical characteristics compared to those of the Comparative Example.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing an organic light emitting diode (OLED) display device, comprising:
    providing a display panel assembly which includes a first substrate having a display area and a mounting area, a second substrate coupled to the display area of the first substrate, and an integrated circuit chip mounted in the mounting area of the first substrate;
    providing a cover window;
    coating an adhesive material onto one surface of the cover window after the second substrate has been coupled to the first substrate;
    coupling the cover window to the display panel assembly so that said one surface of the cover window on which the adhesive material is provided is opposite the second substrate and the integrated circuit chip;
    diffusing the adhesive material so as to fill up a space between the second substrate and the cover window and a space between the mounting area of the first substrate and the cover window; and
    forming an adhesive layer by curing the adhesive material.

2. The method of claim 1, wherein the adhesive material includes an acryl-based resin, and the adhesion layer is formed by curing the adhesive material through one of radiating ultraviolet (UV) rays and applying heat to the adhesive material.

3. The method of claim 1, further comprising:
    allowing a part of the adhesive material provided on the cover window to flow and to contact a part of the display panel assembly, and then
    coupling the cover window and the display panel assembly.

4. The method of claim 1, further comprising:
    receiving the display panel assembly in a support member;
    providing the support member with a bottom portion formed in parallel with the first substrate, and a side wall which extends from the bottom portion and which surrounds side surfaces of the first substrate and the second substrate, the support member being comprised of a material having high rigidity and being produced by one of a deep drawing process or a bending process; and
    disposing the side wall apart by a predetermined distance from edges of the first substrate and the second substrate.

5. The method of claim 4, wherein the forming the adhesive layer comprises filling and curing the adhesive material in a space between the side wall and the edges of the first substrate and the second substrate.

6. The method of claim 4, wherein the predetermined distance is greater than 200 μm.

7. The method of claim 1, wherein the first substrate comprises an integrated circuit chip, pad electrodes and data and scan drivers, wherein the cover window is absent of any integrated circuit chips, pad electrodes and data and scan drivers.

8. The method of claim 1, further comprising attaching a polarizing plate to a surface of the second substrate furthest from the first substrate to suppress a reflection of external light, the adhesive layer being arranged between the cover window and the polarizing plate.

9. The method of claim 1, wherein the providing the display panel assembly comprises disposing a sealant along an edge of the second substrate prior to the coupling of the second substrate to the first substrate, the adhesive layer being arranged entirely external to the coupled first and second substrates.

10. The method of claim 1, further comprising:
    providing a printed circuit board (PCB) and a flexible printed circuit board (FPCB); and
    connecting one side of the FPCB to the first substrate and an opposite side of the FPCB to the PCB to allow a driving signal generated in the PCB to be transferred to the integrated circuit chip via the FPCB.

11. The method of claim 4, the support member being comprised of a material selected from a group consisting of stainless steel, cold rolling steel, aluminum, aluminum alloy, nickel alloy, magnesium and magnesium alloy.

12. The method of claim 1, further comprising:
    forming a support member having a bottom portion and sidewalls extending orthogonally from a periphery of the bottom portion by bending a piece of highly rigid metal;
    placing the display panel onto a surface of the bottom portion of the support member so that the first substrate contacts the bottom portion and so that edge portions of the first substrate are spaced apart from the sidewalls by a gap of at least 200 μm; and
    filling said gap with said adhesive material.

13. The method of claim 1, wherein the adhesive layer is comprised of an acryl-based resin and has an index of refraction similar to that of the cover window.

14. The method of claim 1, wherein only the adhesive layer is arranged between the integrated circuit chip and the cover window.

15. The method of claim 12, further comprising:
    providing a printed circuit board (PCB) and a flexible printed circuit board (FPCB); and
    connecting one side of the FPCB to the first substrate and an opposite side of the FPCB to the PCB to allow a driving signal generated in the PCB to be transferred to the integrated circuit chip via the FPCB, the connecting being done prior to said filling said gap with said adhesive material.

16. The method of claim 4, further comprising:
    providing a printed circuit board (PCB) and a flexible printed circuit board (FPCB); and connecting one side of the FPCB to the first substrate and an opposite side of the FPCB to the PCB to allow a driving signal generated in the PCB to be transferred to the integrated circuit chip via the FPCB.

17. The method of claim 9, wherein the adhesive layer is arranged only external to the display panel assembly and external to the coupled first and second substrates.

18. The method of claim 1, wherein the cover window comprises a light transmitting portion corresponding to a central portion of the display area and a light blocking portion corresponding to an entirety of the mounting area and an edge of the display area.

19. The method of claim 1, wherein the second substrate is smaller than the first substrate by an area equal to the mounting area of the first substrate, the cover window covering a same area as the first substrate and comprising a light transmitting portion corresponding to a central portion of the display area and a light blocking portion corresponding to an edge of the display area that includes an entirety of the mounting area.

20. The method of claim 1, wherein the second substrate is coupled to the first substrate by applying a sealant along an edge of the second substrate and then coupling the second substrate to the first substrate.

* * * * *